United States Patent
Shimizu

(10) Patent No.: US 6,725,351 B1
(45) Date of Patent: Apr. 20, 2004

(54) DATA COMMUNICATION DEVICE HAVING A BUFFER IN A NONVOLATILE STORAGE DEVICE

(75) Inventor: Tomoyasu Shimizu, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 749 days.

(21) Appl. No.: 09/634,470

(22) Filed: Aug. 9, 2000

(30) Foreign Application Priority Data

Aug. 9, 1999 (JP) ............................................ 11-225004

(51) Int. Cl.[7] .............................................. G06F 12/00
(52) U.S. Cl. ........................ 711/173; 711/103; 711/165; 365/185.33; 365/185.04
(58) Field of Search ................................. 711/171, 103, 711/165, 155, 129, 154, 173, 159, 160, 133–136; 707/206; 365/185.04, 185.33

(56) References Cited

U.S. PATENT DOCUMENTS 6,073,206 A * 6/2000 Piwonka et al. ............ 707/202
6,188,602 B1 * 2/2001 Alexander et al. ..... 365/185.04
6,209,069 B1 * 3/2001 Baltar .................... 365/185.11

FOREIGN PATENT DOCUMENTS

JP 2000035916 A * 2/2000 .......... G06F/12/06

* cited by examiner

Primary Examiner—Matthew Kim
Assistant Examiner—Matthew D. Anderson
(74) Attorney, Agent, or Firm—Keating & Bennett, LLP

(57) ABSTRACT

A data communication device which includes a flash memory, a primary buffer region in the flash memory which has time-sequential information stored therein from earliest to, an auxiliary buffer region in the flash memory which receives and stores primary-buffer storage information to be stored in the primary buffer region during a first condition of the data communication device when the information stored in the primary buffer region is not allowed to be updated, and an information-storage control unit which, when the primary-buffer storage information is stored in the auxiliary buffer region and during a second condition of the data communication device when updating of the information in the primary buffer region is allowed, reads information having a size not more than the storage capacity of the primary buffer region from the information stored in said primary buffer region and the auxiliary buffer region, and which re-stores the information that has been read in the primary buffer region.

19 Claims, 3 Drawing Sheets

DATA COMMUNICATION DEVICE HAVING A BUFFER IN A NONVOLATILE STORAGE DEVICE

BACKGROUND OF THE INVENTION

1. Field of the Invention

The present invention relates to data management in a data communication device such as a PHS (Personal Handyphone System).

2. Description of the Related Art

FIG. 2 shows the construction of the main components of a typical data communication device 1. The data communication device 1 includes an antenna 2, a radio frequency unit (RFU) 3, a baseband IC (BBIC) 4, a CPU (Central Processing Unit) 5, a RAM (Random Access Memory) 6, a flash memory 7, an EEPROM (Electrically Erasable Programmable Read-Only Memory) 8, and a DTE I/F (Data Terminal Equipment Interface) 9.

When the antenna 2 receives a signal, the data communication device 1 causes the RFU 3 and the BBIC 4 to extract various predetermined information (data) from the received signal and output the data to the CPU 5. The CPU 5 performs various functions based on the information.

When the data communication device 1 transmits information, the CPU 5 outputs the desired information to the BBIC 4. The BBIC 4 and the RFU 3 cause the information to be carried on a transmission signal and then to be transmitted from the antenna 2.

As shown in FIG. 2, the data communication device 1 is provided with three types of storage devices, namely RAM 6, flash memory 7, and an EEPROM 8. When necessary, the CPU 5 controls these storage devices so as to write information to such storage devices or read information therefrom.

The flash memory 7 is a nonvolatile storage device which allows information to be retained even while power is not applied. The flash memory 7 is basically divided into a program storage region 7a for storing a communication program and the like for the data communication device 1 therein and a data storage region 7b for storing information (data) therein. The data storage region 7b is divided into a plurality of sectors 10, 10a, each of which can store at least one piece of information therein.

The EEPROM 8 is a nonvolatile storage unit in which a buffer 11 is formed. The buffer 11 is used, for example, for sequentially storing predetermined information (buffer storage information) such as the result of computations which are continuously made in accordance with operation of the CPU 5.

FIG. 3 shows an example configuration of the buffer 11. As shown in FIG. 3, a plurality of storage units R is formed in the buffer 11 by sectioning the buffer 11. Each storage unit R contains one piece of information. The order of storage of buffer storage information in each storage unit R is predetermined. For example, when buffer storage information Data1 occurs in accordance with the operation of the CPU 5 or the like, the buffer storage information Data1 is stored in a first storage unit R1. When buffer storage information Data2 occurs, the buffer storage information Data2 is stored in a storage unit R2, which is next to the unit R1. When buffer storage information Data3 occurs, the buffer storage information Data3 is stored in a storage unit R3, which is next to the unit R2.

Thus, the buffer storage information Data1, Data2, Data3, etc. are sequentially stored in the storage units R1, R2, R3, etc., respectively, in accordance with order of occurrence of the buffer storage information Data. Finally, a storage unit 31,643 stores buffer storage information DataN therein. Storage unit 31,643 is the last storage unit in the buffer 11. When storage of another buffer storage information is required, storage occurs in the first storage unit R1 again. In the above-described manner, subsequent buffer storage information is stored in the storage units R2, R3, etc. in accordance with the order of occurrence of the information. When buffer storage information is stored in a storage unit R which already contains information, the storing operation is hereinafter referred to as an updating operation.

As described above, the buffer 11 is provided in the EEPROM 8. However, in order to achieve faster processing as well as to hold information stored in the buffer even while the power is off, the buffer 11 can be provided in the flash memory 7.

When the buffer 11 is provided in the flash memory 7, one sector 10a among a plurality of sectors 10 in the flash memory 7 serves as the buffer 11. However, the following problems can arise.

Since a characteristic feature of the flash memory 7 is that information is deleted only sector by sector, it is impossible to delete one piece of information among a plurality of pieces of information stored in the buffer, i.e., in the sector 10a. Accordingly, when the buffer 11 is provided in the flash memory 7, information already stored in the storage unit R of the buffer 11 is updated with newly occurring buffer storage information in accordance with the following procedure.

For example, assume that the CPU 5 causes the storage unit R2 to update (replace) the buffer storage information Data2 therein with new buffer storage information DataW. Initially, the CPU 5 reads all information stored in the buffer 11 and writes it in the RAM 6 (duplication).

After all information is duplicated from the buffer 11 to the RAM 6, the information stored in the buffer 11 of the flash memory 7 is deleted. Since the information stored in the RAM 6 can be deleted or modified piece by piece (not sector by sector), the information Data2 is replaced by the buffer storage information DataW in RAM 6. Subsequently, the modified duplicated information of the buffer 11 is read from the RAM 6 and is stored in the currently empty buffer 11.

Thus, the updating operation of the duplicated information in the buffer 11 is completed.

As described above, when the buffer storage information is updated in the buffer 11, all information stored in the buffer 11 must be deleted. Deletion of the information stored in the buffer 11 (the sector 10a) requires approximately one second. Furthermore, while the information is being deleted, no other processing (in other words, no other tasks) can be performed, because the deletion of the information in the buffer 11 cannot be interrupted. This means that when the buffer 11 is provided in the flash memory 7, the information deleting operation of the buffer 11 cannot be performed, and therefore the buffer storage information stored in the buffer 11 cannot be updated, while the data communication device 1 is communicating.

Due to this problem, it has up to now been impractical to provide the buffer 11 in the flash memory 7.

SUMMARY OF THE INVENTION

Accordingly, it is an object of the present invention to provide a communication device in which a buffer is formed in a nonvolatile storage device such as a flash memory in order to achieve faster information processing.

To this end, according to one aspect of the invention, a data communication device may comprise:

a flash memory;

a primary buffer region provided in the flash memory and having a plurality of pieces of information stored therein time-sequentially from an earliest piece of information to a latest piece of information;

an auxiliary buffer region provided in the flash memory for receiving and storing pieces of primary-buffer storage information to be stored in the primary buffer region in the auxiliary buffer region during a first condition of the data communication device when the information stored in the primary buffer region is not allowed to be updated; and an information-storage control unit for, when the primary-buffer storage information is stored in the auxiliary buffer region and during a second condition of the data communication device when updating of the information in the primary buffer region is allowed, reading information having a size not more than the storage capacity of the primary buffer region from the primary buffer region and the auxiliary buffer region, and re-storing the information that has thus been read in the primary buffer region.

According to this aspect of the invention, the primary information is stored in an auxiliary buffer in the flash memory, without requiring a deleting operation, which is advantageous since the deleting operation is not permitted during an information-updating invalid period of the information stored in the primary buffer region, which occurs for example when the data communication device is communicating. Hence, the invention can avoid the conventional problem in which, since the information-updating operation requires an information deleting operation, the primary-buffer storage information cannot be stored in the primary buffer during the information-updating invalid period of the information in the primary buffer region. The invention thereby permits the data communication device to have the buffer formed in the flash memory.

Advantageously, a storage capacity of said auxiliary buffer region is greater than said storage capacity of said primary buffer region.

In the data communication device according another aspect of the invention, when the primary-buffer storage information is stored in the auxiliary buffer region and during the second condition of the data communication device, the information-storage control unit is arranged to read unprocessed information from the primary buffer region and the auxiliary buffer region and then to re-store the read unprocessed information in the primary buffer region.

According to a further aspect of the invention, the data communication device may comprise an information-reading unit for reading information stored in the primary buffer region and the auxiliary buffer region when the primary-buffer storage information is stored in the auxiliary buffer region and when updating of the information in the primary buffer region is allowed; an information-updating unit for deleting all the information stored in the primary buffer region and for storing the information read by the information-reading unit in the primary buffer region; and an auxiliary-buffer storage-preparing unit for, after the primary-buffer storage information stored in the auxiliary buffer region is stored in the primary buffer region, deleting all the information stored in the auxiliary buffer region so as to be ready for further information storage.

After updating the information in the primary buffer region is again allowed, and information stored in the auxiliary buffer region is re-stored in the primary buffer region, the auxiliary-buffer storage-preparing unit deletes all the information stored in the auxiliary buffer region. Thus, the auxiliary buffer region having no information therein can be made ready for further primary buffer information when the data communication device is in the information-updating invalid period of the information in the primary buffer region.

As described above, during the information-updating invalid period of the information in the primary buffer region, when the primary-buffer storage information occurs, the primary-buffer storage information can be instantly stored in the auxiliary buffer storage unit without requiring any information deleting operation to be performed.

Moreover, advantageously, the information-updating unit and the auxiliary-buffer storage-preparing unit are arranged to carry out the deletion operation during an idle period of the data communication device, or during a series of such idle periods. Since information stored in the primary and auxiliary buffer regions can advantageously be deleted without requiring a specific time or times to be set aside for deleting the information, the data communication device can be efficiently operated.

In the data communication device, the storage capacity of the auxiliary buffer region is advantageously greater than the storage capacity of the primary buffer region, including a safety margin. Since a safety margin is provided in the capacity of the auxiliary buffer region, a situation can be avoided in which, during the information-updating invalid period of information in the primary buffer region, the primary-buffer storage information cannot be stored in the auxiliary buffer region because there is not enough space to store the information in the auxiliary buffer region.

Further aspects of the invention relate to methods of data management in a communication device.

Other features and advantages of the invention will be understood from the following detailed description of an embodiment thereof, with reference to the drawings.

BRIEF DESCRIPTION OF THE DRAWINGS

For the purpose of illustrating the invention, there is shown in the drawings an embodiment of the invention, it being understood, however, that the invention is not limited to the precise arrangements and instrumentalities shown.

DETAILED DESCRIPTION OF AN EMBODIMENT OF THE INVENTION

Figure 1:
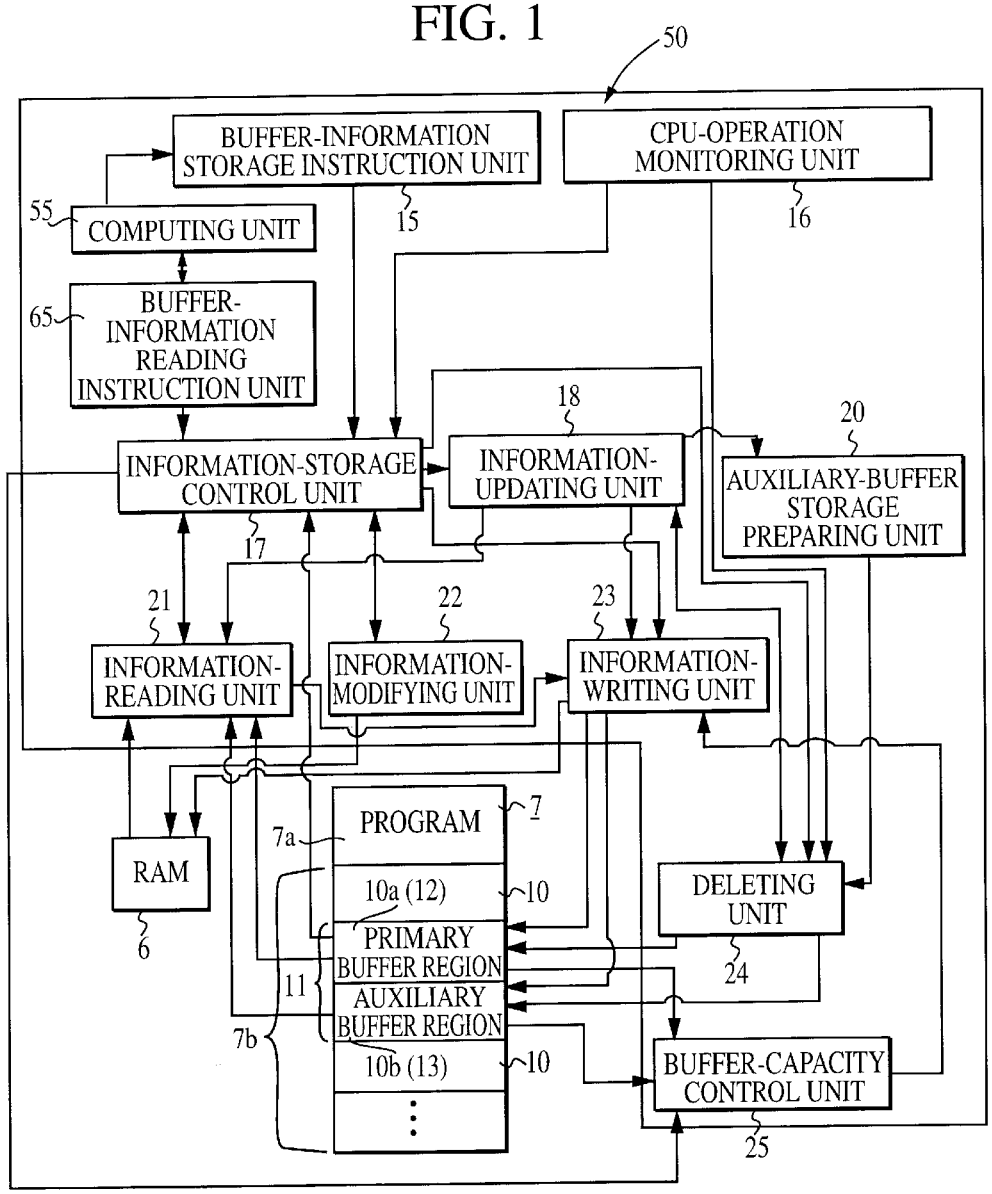
FIG. 1 is a block diagram showing an embodiment according to the present invention.
Figure 2:
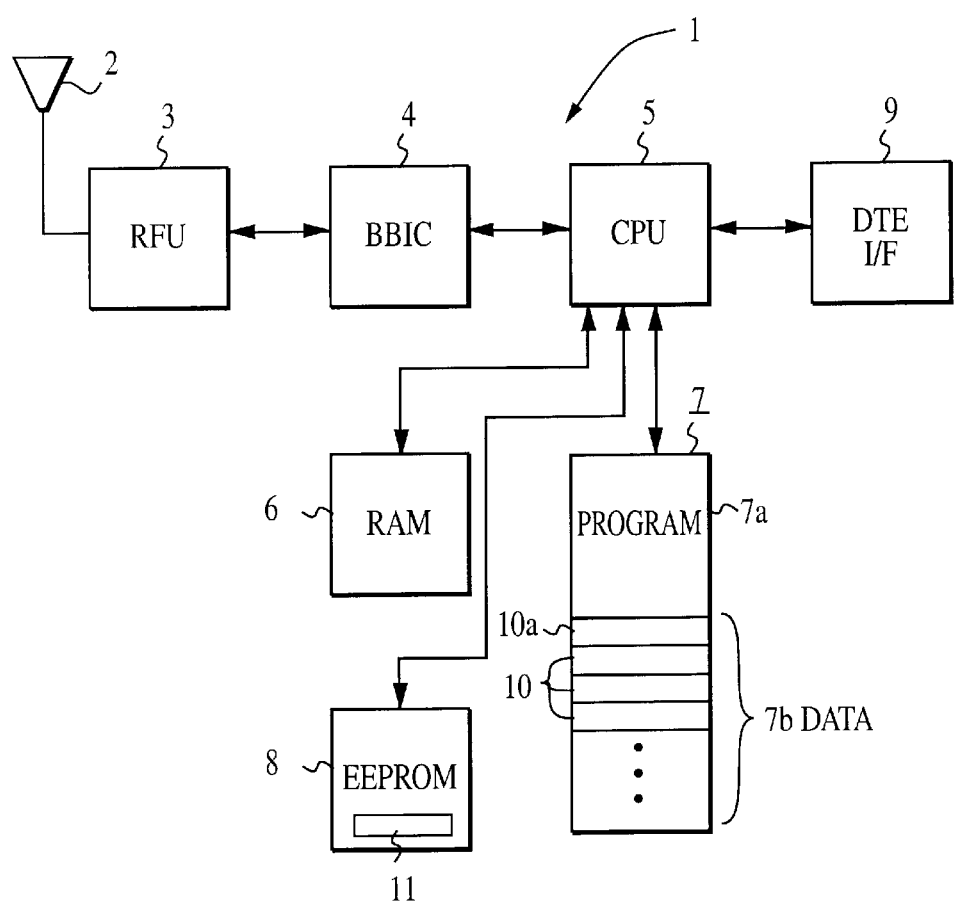
FIG. 2 is a block diagram showing main components of a prior art data communication device.

Referring now to the drawing figures in which like reference designators refer to like elements, there is shown in FIG. 1 a buffer 11 comprising a primary buffer region 12 and an auxiliary buffer region 13 provided respectively in sectors 10a and 10b in a flash memory 7, and a CPU 50 constructed as shown in FIG. 1. The construction of the present embodiment is substantially identical to that of the conventional data communication device shown in FIG. 2, with the exception of the arrangement of new CPU 50 within device 1 in place of prior art CPU 5. Components that are identical to corresponding components in FIG. 2 have the same reference numerals, and a repeated description thereof is omitted.

Figure 3:
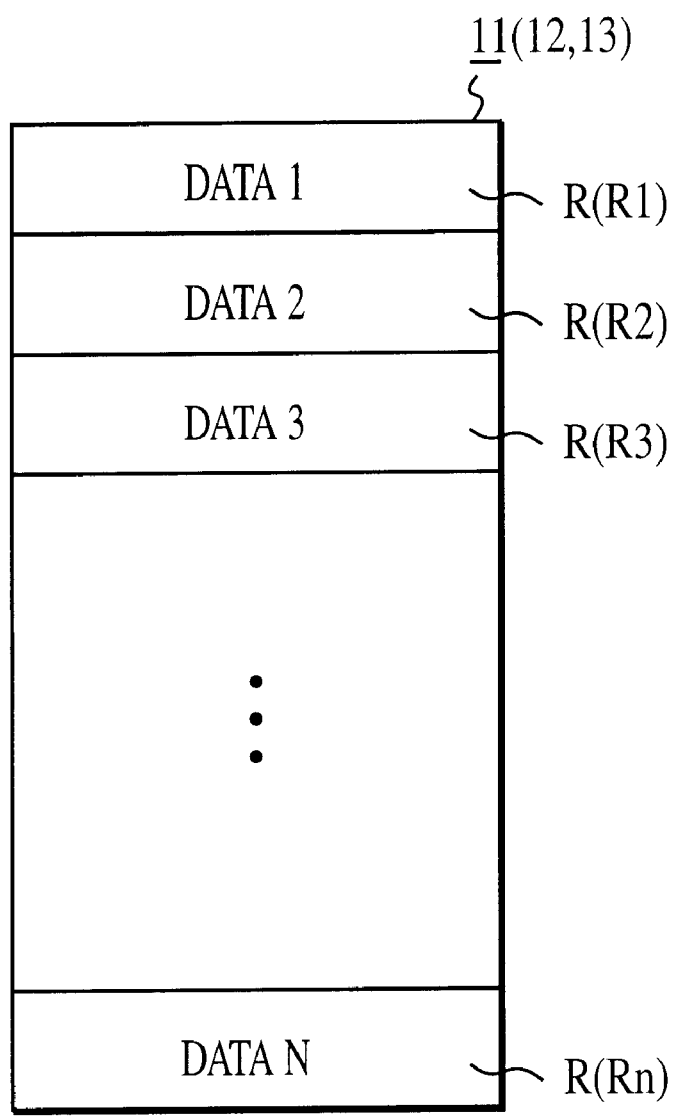
FIG. 3 is an illustration showing a prior art buffer.

The primary buffer region 12 and the auxiliary buffer region 13, which are provided in the flash memory 7, constitute a buffer 11 (see FIG. 3). The primary buffer region 12 includes one sector 10a of the flash memory 7. As shown in FIG. 3, a plurality of storage units R is obtained by sectioning the primary buffer region 12. Although the auxiliary buffer region 13 is formed to have the same construction, the storage capacity thereof is advantageously greater than that of the primary buffer region 12. For example, the storage capacity of the auxiliary buffer region 13 may correspond to the total of the amount of primary-buffer storage information which occurs during an information-update invalid period of the primary buffer region 12 (i.e., during a period in which updating of information stored in the primary buffer region 12 is disabled, for example, while the data communication device 1 is communicating), plus a margin of safety, and plus the capacity of the primary buffer region 12.

In the present embodiment, the CPU 50 is constructed so as to control storage of information in the primary buffer region 12 and the auxiliary buffer region 13. That is, as shown in FIG. 1, the CPU 50 includes a buffer-information storage-instruction unit 15, a CPU-operation monitoring unit 16, an information-storage control unit 17, an information-updating unit 18, an auxiliary-buffer storage-preparing unit 20, an information-reading unit 21, an information-modifying unit 22, an information-writing unit 23, a deleting unit 24, and a buffer-capacity control unit 25.

The CPU-operation monitoring unit 16 is arranged to monitor operations of the CPU 50. The buffer-information storage-instruction unit 15 is arranged to output primary-buffer storage information to the information-storage control unit 17 as an information storage instruction when predetermined primary-buffer storage information, such as the result of a computation, occurs.

The information-storage control unit 17 controls an information-storage operation to store the primary-buffer storage information in the primary buffer region 12 or the auxiliary buffer region 13. For example, the information-storage control unit 17 functions as follows.

When the buffer-information storage-instruction unit 15 outputs the primary-buffer storage information to the information-storage control unit 17, the information-storage control unit 17 determines via the information-reading unit 21 whether there is an empty storage unit R in the primary buffer region 12 of the flash memory 7.

When the information-storage control unit 17 determines that there is an empty storage unit R, it outputs the primary-buffer storage information to the information-writing unit 23. The information-writing unit 23 stores the primary-buffer storage information in the empty storage unit R. Thus, the storage of primary-buffer storage information is completed.

On the other hand, when the information-storage control unit 17 determines that there is no empty storage unit R in the primary buffer region 12, the primary-buffer storage information in the primary buffer region 12 is updated .

The information-storage control unit 17 obtains monitoring information from the CPU-operation monitoring unit 16 and determines, based on the monitoring information, whether the data communication device 1 is in the information-updating invalid period of the primary buffer region 12. When the data communication device 1 is determined not to be in the invalid period, the information-storage control unit 17 causes the information-reading unit 21, the information-modifying unit 22, and the information-writing unit 23 to be activated in order to update the primary-buffer storage information in the primary buffer region 12.

In particular, the information-storage control unit 17 outputs a read instruction to the information-reading unit 21. The information-reading unit 21 reads all information stored in the primary buffer region 12 in accordance with the read instruction and outputs the information to the information-writing unit 23. The information-storage control unit 17 outputs a write instruction to the information-writing unit 23. The information-writing unit 23 writes (duplicates) the information output from the information-reading unit 21 to the RAM 6 in accordance with the write instruction.

Thus, after all information stored in the primary buffer region 12 is duplicated in the RAM 6, the information-storage control unit 17 outputs primary-buffer storage information to the information-modifying unit 22 and outputs a delete instruction to the deleting unit 24. The information-modifying unit 22 modifies the duplicated primary-buffer storage information stored in the RAM 6. The deleting unit 24 deletes all information stored in the primary buffer region 12 in accordance with the delete instruction.

After information modification by the information-modifying unit 22 and information deletion by the deleting unit 24 are completed, the information-storage control unit 17 causes the information-reading unit 21 to read the modified duplicated information of the primary buffer region 12 stored in the RAM 6. The information-writing unit 23 stores the modified duplicated information in the empty primary buffer region 12. Thus, when the data communication device 1 is determined to be in the information-updating valid period (state) of the primary buffer region 12, the updating operation of the duplicated information of the primary buffer region 12 in the primary buffer region 12 is completed.

When the data communication device 1 is determined to be in the information updating invalid period (state) of the primary buffer region 12, the information-storage control unit 17 controls the storage operation of the primary-buffer storage information as follows. For example, when (1) there is no empty storage unit R in the primary buffer region 12; (2) the information-storage control unit 17 detects, based on the monitoring information of the CPU-operation monitoring unit 16, that the CPU 5 is in the information-updating invalid period of the buffer region 12; and (3) there is primary-buffer storage information to be stored, the information-writing unit 23 stores the primary-buffer storage information in the auxiliary buffer region 13.

When the primary-buffer storage information is stored in the auxiliary buffer region 13, and when the information-storage control unit 17 detects, based on the monitoring information of the CPU-operation monitoring unit 16, that a transition from the information-updating invalid state to the information-updating valid state of the primary buffer region 12 occurs, the information-storage control unit 17 outputs an information-sorting start instruction to the information-updating unit 18. In accordance with this instruction, the information-updating unit 18 causes the information-reading unit 21, the information-writing unit 23, and the deleting unit 24 to store information having a size equal to the storage capacity of the primary buffer region 12 in the primary buffer region 12 in chronological order starting from the latest information among information stored in the primary buffer region 12 and the auxiliary buffer region 13.

To be specific, in accordance with the information-sorting start instruction, the information-updating unit 18 causes the information-reading unit 21 to read information having a size equal to the storage capacity of the primary buffer region 12 from the information stored in the primary buffer region 12 and the auxiliary buffer region 13. If the size of information stored in the auxiliary buffer region 13 is more than the storage capacity of the primary buffer region 12, only information having a size which is equal to the storage capacity of the primary buffer region 12 is read from the information stored in the auxiliary buffer region 13.

If the size of the information stored in the auxiliary buffer region 13 is less than the storage capacity of the primary buffer region 12, additional information is read from the information stored in the primary buffer region 12, so that the total of the size of all information stored in the auxiliary buffer region 13, plus the size of the information stored in the primary buffer region 12 that has been read, equals the storage capacity of the primary buffer region 12.

The information-reading unit 21 outputs the information read in the above-described manner to the information-writing unit 23. Moreover, the information-updating unit 18 outputs the write instruction to the information-writing unit 23 to cause the read information to be duplicated in the RAM 6.

The information-updating unit 18 outputs the delete instruction to the deleting unit 24 in accordance with the information-sorting start instruction. The deleting unit 24 periodically obtains the monitoring information from the CPU-operation monitoring unit 16 and determines, based on the monitoring information, whether the data communication device 1 is idle. After the deleting unit 24 receives the delete instruction from the information-updating unit 18, the deleting unit 24 can delete information stored in the primary buffer region 12. However, the deletion occurs only during a period in which the data communication device 1 is determined to be idle.

An idle period of the data communication device 1 is normally sufficiently longer than the time required to delete all information stored in the primary buffer region 12. Hence, the deleting unit 24 can usually delete all information stored in the primary buffer region 12 during one idle period. However, when short idle periods occur intermittently, all information stored in the primary buffer region 12 cannot be deleted during one idle period. In this case, the information is deleted over several idle periods.

When the information-updating unit 18 detects that the deleting unit 24 has deleted all information stored in the primary buffer region 12, the information-reading unit 21 reads from the RAM 6 either duplicated primary buffer region 12 information and auxiliary buffer region 13 information, or duplicated auxiliary buffer region 13 information, and the information-writing unit 23 stores the duplicated information in the empty primary buffer region 12.

Thus, the information-updating unit 18 re-stores information having a size equal to the storage capacity of the primary buffer region 12 in the primary buffer region 12 from the information stored in the primary buffer region 12 and the auxiliary buffer region 13, whereby sorting of information stored in the buffer 11 is completed.

Information is read and processed by a computing unit 55 in the CPU 50 from the information stored in the primary buffer region 12 and the auxiliary buffer region 13, in chronological order starting from the oldest information (FIFO). The buffer-information reading instruction unit 65 reads data from the buffer region in response to an instruction issued by the computing unit 55. The read-out data is forwarded to the computing unit 55. Similarly, the computing unit 55 issues an instruction to the buffer-information storage instruction unit 15 in order to store the result of a computation in a buffer. Thus, the computing unit 55 controls both the information-storage control unit 17 and the buffer-information storage-instruction unit 15.

Accordingly, if the total of the size of unprocessed information stored in the primary storage buffer 12 and that of unprocessed information stored in the auxiliary storage buffer 13 exceeds the storage capacity of the primary buffer region 12, sorting of information stored in the buffer 11 would lead to a serious problem in that some necessary information would be deleted. (The term "processed" refers to information that has been taken out of the FIFO buffer for use by the CPU for performing computations. "Unprocessed" information is information that has not yet been taken out of the buffer by the CPU.)

If it is detected that the primary-buffer storage information is stored in the auxiliary buffer region 13, based on operation information of the information-storage control unit 17, the buffer-capacity control unit 25 monitors the amount of unprocessed information among information stored in the primary buffer region 12 and the auxiliary buffer region 13. When the buffer-capacity control unit 25 determines that the amount of unprocessed information is about to exceed the capacity of the primary buffer region 12, it prevents additional primary-buffer storage information from being written in the auxiliary buffer region 13. Accordingly, the buffer-capacity control unit 25 can avoid the foregoing problem in which some necessary information may be deleted when information in the buffer 11 is sorted.

After detecting, based on the control operation of the information-updating unit 18, that sorting of information in the buffer 11 is completed, the auxiliary-buffer storage-preparing unit 20 causes the deleting unit 24 to delete information stored in the auxiliary buffer region 13.

When information stored in the auxiliary buffer region 13 is deleted, the deleting unit 24 deletes information in the auxiliary buffer region 13 in the same manner as the deletion in the primary buffer region 12 during idle periods of the data communication device 1. This causes the auxiliary buffer region 13 to be ready for another information storage action.

According to the present embodiment, the primary buffer region 12 and the auxiliary buffer region 13 are provided in the flash memory 7. When the data communication device 1 is idle and when there is no empty storage unit R in the primary buffer region 12, the primary-buffer storage information is arranged to be stored in the auxiliary buffer region 13. Furthermore, the auxiliary-buffer storage-preparing unit 20 is arranged to delete information stored in the auxiliary buffer region 13 so that the auxiliary buffer region 13 is ready for further information storage during the information updating invalid period of the primary buffer region 12.

The above-described arrangement enables the primary-buffer storage information to be stored in the primary buffer region 12 or the auxiliary buffer region 13 during the information-updating invalid period of the primary buffer region 12 without performing a time-consuming information deletion operation. Hence, the invention solves the foregoing problem of the inability of the primary-buffer storage information to be stored in the buffer during the information-updating invalid period of the primary buffer region 12.

Information in the primary buffer region 12 and that of the auxiliary buffer region 13 are arranged to be deleted during idle periods of the data communication device 1. Accordingly, information to be deleted can be deleted during periods in which no other processing is performed, without requiring a specific time for the information deleting operation to be arranged. Therefore, the present invention advantageously allows the CPU 50 to operate efficiently.

Since the storage capacity of the auxiliary buffer region 13 is arranged to be greater than that of the primary buffer region 12, in order to avoid a situation in which no empty storage unit for storing the primary-buffer storage information therein is available in the auxiliary buffer region 13 during the information-updating invalid period of the primary buffer region 12, the primary-buffer storage information can be reliably stored in the auxiliary buffer region 13.

Thus, the invention enables a flash memory to be used to form a primary buffer 12, and further, the buffer can be used as a FIFO buffer. In the prior art, using a conventional RAM, old information which has already been used by a CPU can be overwritten by new information. The CPU can read the data out in chronological order starting from the oldest information to realize a FIFO process. However, such overwriting is not practical in a flash memory. The appropriate way to change the contents of a flash memory is to collectively delete all data in a section of the flash memory. Thus, it has not been practical to use a flash memory as a FIFO buffer. To address .this problem, the invention provides two buffers in a flash memory. When new data is to replace data in a FIFO buffer, the new data is first stored in an auxiliary buffer, for example. (If the primary buffer is available, the new data may be stored directly in the primary buffer.) Then, the CPU waits until the primary buffer becomes accessible. Upon detecting the accessible state of the primary buffer, unprocessed data from the primary buffer is moved to an external RAM, for example. Further, the new data, which the CPU has not yet accessed, is also moved to the RAM and is merged with the data which had been moved from the primary buffer. Finally, the merged data is moved from the RAM to the primary buffer. By this process, the processed data in the primary buffer, which is no longer needed, is overwritten.

The present invention is not limited to the above-described embodiment and it may take various alternate forms. For example, although in the described embodiment information read from the primary buffer region 12 or the auxiliary buffer region 13 is temporarily stored in the RAM 6, the information may instead be stored in the EEPROM 8 or in built-in memory of the CPU 50.

In the described embodiment, the storage capacity of the auxiliary buffer region 13 is arranged to be greater than that of the primary buffer region 12. However, if a pre-calculable storage capacity of the primary-buffer storage information occurring during the information-updating invalid period of the primary buffer region 12 is sufficiently less than the capacity of the primary buffer region 12, for example, the storage capacity of the auxiliary buffer region 13 may be less than that of the primary buffer region 12.

Although the auxiliary buffer region 13 is formed using one sector 10b in the present embodiment, the auxiliary buffer region 13 may be formed using more than one sector.

When information is stored in the auxiliary buffer region 13 and when a transition from the information-updating invalid state to the information-updating valid state of the primary buffer region 12 occurs, information having a size equal to the storage capacity of the primary buffer region 12 is read from the information stored in the primary buffer region 12 and the auxiliary buffer region 13 and it is re-stored in the primary buffer region 12. Alternatively, only unprocessed information (necessary information) from among the information stored in the primary buffer region 12 and the auxiliary buffer region 13 may be read and re-stored in the primary buffer region 12. The buffer-capacity control unit 25 controls the amount of the unprocessed information so that the amount of unprocessed information remains less than the capacity of the primary buffer region 12.

In addition, an example has been described in which a PHS is employed as the data communication device 1. However, the present invention can be applied to a data communication device other than a PHS.

Although the present invention has been described in relation to particular embodiments thereof, many other variations and modifications and other uses will become apparent to those skilled in the art. Therefore, the present invention is not limited by the specific disclosure herein.

What is claimed is:

1. A data communication device comprising:
    a flash memory;
    a primary buffer region provided in said flash memory and having a plurality of pieces of information stored therein time-sequentially from an earliest piece of information to a latest piece of information;
    an auxiliary buffer region provided in said flash memory for receiving and storing pieces of primary-buffer storage information to be stored in said primary buffer region in said auxiliary buffer region during a first condition of said data communication device when the information stored in said primary buffer region is not allowed to be updated; and
    an information-storage control unit for, when the primary-buffer storage information is stored in said auxiliary buffer region and during a second condition of said data communication device when updating of the information in said primary buffer region is allowed, reading information having a size not more than the storage capacity of said primary buffer region from the information stored in said primary buffer region and said auxiliary buffer region, and re-storing the information that has thus been read in said primary buffer region.

2. A data communication device according to claim 1, wherein a storage capacity of said auxiliary buffer region is greater than said storage capacity of said primary buffer region.

3. A data communication device according to claim 1, wherein, when the primary-buffer storage information is stored in said auxiliary buffer region and during said second condition of the data communication device, said information-storage control unit is arranged to read unprocessed information from the information stored in said primary buffer region and said auxiliary buffer region and then to re-store the read unprocessed information in said primary buffer region.

4. A data communication device according to claim 3, wherein a storage capacity of said auxiliary buffer region is greater than said storage capacity of said primary buffer region.

5. A data communication device according to claim 3, further comprising:
    an information-reading unit for reading information from the information stored in said primary buffer region and said auxiliary buffer region when the primary-buffer storage information is stored in said auxiliary buffer region and when updating of the information in said primary buffer region is allowed;
    an information-updating unit for deleting all the information stored in said primary buffer region and for storing the information read by said information-reading unit in said primary buffer region; and an auxiliary-buffer storage-preparing unit for, after the primary-buffer storage information stored in said auxiliary buffer region is stored in said primary buffer region, deleting all the information stored in said auxiliary buffer region so as to be ready for further information storage.

6. A data communication device according to claim 5, wherein a storage capacity of said auxiliary buffer region is greater than said storage capacity of said primary buffer region.

7. A data communication device according to claim 5, wherein said information-updating unit and said auxiliary-buffer storage-preparing unit are arranged to delete deletion information during an idle period of said data communication device.

8. A data communication device according to claim 7, wherein a storage capacity of said auxiliary buffer region is greater than said storage capacity of said primary buffer region.

9. A data communication device according to claim 1, further comprising:

an information-reading unit for reading information from the information stored in said primary buffer region and said auxiliary buffer region when the primary-buffer storage information is stored in said auxiliary buffer region and when updating of the information in said primary buffer region is allowed;

an information-updating unit for deleting all the information stored in said primary buffer region and for storing the information read by said information-reading unit in said primary buffer region; and an auxiliary-buffer storage-preparing unit for, after the primary-buffer storage information stored in said auxiliary buffer region is stored in said primary buffer region, deleting all the information stored in said auxiliary buffer region so as to be ready for further information storage.

10. A data communication device according to claim 9, wherein a storage capacity of said auxiliary buffer region is greater than said storage capacity of said primary buffer region.

11. A data communication device according to claim 9, wherein said information-updating unit and said auxiliary-buffer storage-preparing unit are arranged to delete deletion information during an idle period of said data communication device.

12. A data communication device according to claim 11, wherein a storage capacity of said auxiliary buffer region is greater than said storage capacity of said primary buffer region.

13. A method of storing information in a data communication device, comprising the steps of:

providing a flash memory;

defining a primary buffer region in said flash memory for receiving a plurality of pieces of information therein time-sequentially from an earliest piece of information to a latest piece of information;

defining an auxiliary buffer region in said flash memory for receiving and storing pieces of primary-buffer storage information to be stored in said primary buffer region in said auxiliary buffer region during a first condition of said data communication device when the information stored in said primary buffer region is not allowed to be updated; and when the primary-buffer storage information is stored in said auxiliary buffer region and during a second condition of said data communication device when updating of the information in said primary buffer region is allowed, reading information having a size not more than the storage capacity of said primary buffer region from the information stored in said primary buffer region and said auxiliary buffer region; and re-storing the information that has thus been read in said primary buffer region.

14. A method according to claim 13, wherein a storage capacity of said auxiliary buffer region is greater than said storage capacity of said primary buffer region.

15. A method according to claim 13, further comprising the steps of, when the primary-buffer storage information is stored in said auxiliary buffer region and during said second condition of the data communication device, reading unprocessed information from the information stored in said primary buffer region and said auxiliary buffer region, and then re-storing the read unprocessed information in said primary buffer region.

16. A method according to claim 15, further comprising the steps of:

reading information from the information stored in said primary buffer region and said auxiliary buffer region when the primary-buffer storage information is stored in said auxiliary buffer region and when updating of the information in said primary buffer region is allowed;

deleting all the information stored in said primary buffer region and storing the information read by said information-reading unit in said primary buffer region; and after the primary-buffer storage information stored in said auxiliary buffer region is stored in said primary buffer region, deleting all the information stored in said auxiliary buffer region so as to be ready for further information storage.

17. A method according to claim 16, comprising the step of deleting said information during an idle period of said data communication device.

18. A method according to claim 13, further comprising the steps of:

reading information from the information stored in said primary buffer region and said auxiliary buffer region when the primary-buffer storage information is stored in said auxiliary buffer region and when updating of the information in said primary buffer region is allowed;

deleting all the information stored in said primary buffer region and storing the information read by said information-reading unit in said primary buffer region; and after the primary-buffer storage information stored in said auxiliary buffer region is stored in said primary buffer region, deleting all the information stored in said auxiliary buffer region so as to be ready for further information storage.

19. A method according to claim 18, comprising the step of deleting said information during an idle period of said data communication device.

* * * * *